(12) United States Patent
DiOrio

(10) Patent No.: US 6,975,127 B2
(45) Date of Patent: Dec. 13, 2005

(54) PLANARIZING AND TESTING OF BGA PACKAGES

(75) Inventor: Mark L. DiOrio, Cupertino, CA (US)

(73) Assignee: Celerity Research, Inc., San Jose, CA (US)

( * ) Notice: Subject to any disclaimer, the term of this patent is extended or adjusted under 35 U.S.C. 154(b) by 0 days.

(21) Appl. No.: 10/718,503

(22) Filed: Nov. 19, 2003

(65) Prior Publication Data

US 2004/0217770 A1 Nov. 4, 2004

Related U.S. Application Data

(63) Continuation-in-part of application No. 10/428,572, filed on May 1, 2003.

(51) Int. Cl.[7] ............................................. G01R 31/02
(52) U.S. Cl. ..................... 324/754; 324/755; 324/761
(58) Field of Search ........................... 324/755, 765, 324/754, 158.1, 761, 72.7, 769; 257/48, 737; 29/840, 832, 843; 438/17, 18, 14

(56) References Cited

U.S. PATENT DOCUMENTS

| | | | |
|---|---|---|---|
| 5,055,778 A | * | 10/1991 | Okubo et al. ............... 324/754 |
| 5,289,631 A | * | 3/1994 | Koopman et al. ............. 29/840 |
| 5,513,430 A | | 5/1996 | Yanof et al. |
| 5,604,446 A | * | 2/1997 | Sano .......................... 324/758 |
| 5,642,056 A | | 6/1997 | Nakajima et al. |
| 5,804,983 A | | 9/1998 | Nakajima et al. |
| 5,828,225 A | | 10/1998 | Obikane et al. |
| 6,075,373 A | | 6/2000 | Iino |
| 6,359,456 B1 | | 3/2002 | Hembree et al. |
| 6,426,636 B1 | | 7/2002 | Das et al. |
| 6,426,637 B1 | | 7/2002 | Dang et al. |
| 6,426,639 B2 | * | 7/2002 | Farnworth et al. .......... 324/755 |
| 6,552,555 B1 | | 4/2003 | Nuytkens et al. |
| 6,621,710 B1 | | 9/2003 | Cheng et al. |

* cited by examiner

*Primary Examiner*—Vinh Nguyen
*Assistant Examiner*—Jimmy Nguyen
(74) *Attorney, Agent, or Firm*—David T. Millers

(57) ABSTRACT

The planarity of external terminals or a ball grid array on a device package can be improved through use of test probes that flatten the electrical terminals while forming the electrical contacts for package testing. After testing, the package has external terminals with improved planarity that improves the electrical connections formed during assembly of a system containing the package.

21 Claims, 3 Drawing Sheets

PLANARIZING AND TESTING OF BGA PACKAGES

CROSS-REFERENCE TO RELATED APPLICATION

This patent document is a continuation-in-part and claims benefit of the earlier filing date of U.S. patent application Ser. No. 10/428,572, filed May 1, 2003, which is hereby incorporated by reference in its entirety.

BACKGROUND

Ball grid array (BGA) packages can provides an integrated circuit device with a package having a high density of terminals. FIG. 1A illustrates an example of a conventional BGA package 100 containing a semiconductor device 110 on an interconnect substrate 140. Device 110, which can be any sort of semiconductor device, generally has electrical contact pads that are electrically connected to contact pads or traces on interconnect substrate 140. FIG. 1A shows an example where wire bonds 120 electrically connect semiconductor device 110 to interconnect substrate 140, and an encapsulant 130 protects and insulates wire bonds 120. Alternatively, other electrical connection techniques such as flip-chip packaging techniques can provide the electrical connections to interconnect substrate 140. Interconnect substrate 140 is generally made of an insulating containing the conductive traces (not shown) that provide electrical signals paths. The contact pads or terminals of device 110 are connected to the conductive traces in and on an interconnect substrate 140 and through the conductive traces are connected to external terminals 150.

External terminals 150 can be arranged in an array commonly referred to as a ball grid array (BGA) and are typically metal bumps such as solder balls. Solder in external terminals 150 can be reflowed to attach package 100 to a printed circuit board or other electrical system. A difficulty that can arise when connecting package 100 in an electrical system is non-uniformity of the elevation of terminals 150. In particular, the manufacturing process will generally create some terminals 150' that are larger than average and some terminals 150" that are smaller than average. The smaller terminals 150" may not make good contact to an underlying printed circuit board or system during a reflow or other soldering process, resulting in less dependable connections.

Warping of the interconnect substrate can similarly make electrical connections less dependable. FIG. 1B illustrates a flip-chip package 102 containing device 110. In flip-chip package 102, metal bumps 122 on the contact pads of device 110 contact pads or traces on a interconnect substrate 142. An insulating fill material 132 between device 110 and interconnect substrate 142 can be used to improve the thermal or mechanical properties of package 102.

The manufacturing process for interconnect substrate 142 or the process of attaching interconnect substrate 142 to device 110 can cause warping of substrate 142. In particular, fill material 132 between device 110 and substrate 142, which varies in thickness or shape on interconnect substrate 142, can introduce stress that causes warping. Such warping is particularly common when substrate 142 is relatively thin (e.g., less than about 2 mm thick) for a low profile package. Regardless of the cause, the warping of substrate 142 can change the elevations of terminals 150, moving some of the external terminals 150''' away from the flat surface of a printed circuit board to which package 102 attaches. The warping thus results in a non-planar array of terminals 150 and in less dependable electrical connections.

Methods for improving the planarity of ball grid arrays or other the external terminals of device packages can improve the quality of electrical connections formed when connecting the packages in a larger system.

SUMMARY

In accordance with an aspect of the invention, the planarity of external terminals or a ball grid array on a device package can be improved during device testing through use of test equipment that flatten the electrical terminals while forming the electrical contact for package testing. After the testing, the package has external terminals with improved planarity that improves the electrical connections formed during assembly of a system containing the package.

One specific embodiment of the invention is a process for testing a package containing a device. The process brings probe tips on a tester and external terminals on the package into contact, for example, by plugging the package into a test socket having the probe tips for electrical contacts. Compression forces in the system provides good electrical contact for electrically testing of the device through electrical connections of the probe tip to the external terminals and can deform the external terminals to improve the planarity of the external terminals.

The probe tips can be affixed to a substrate such as a printed circuit board or socket substrate that can be made of the same material as interconnect substrates in the packages being tested. In alternative embodiments, the probe tips can be pads or bumps formed on the substrate. Each probe tip can include a flat contact area and flattens a corresponding one of the external terminals, while simultaneously providing an electrical connection to the external terminals. In particular, a flat contact area having a width that is at least one half of a width of one of the terminals can generally provide adequate flattening of the terminals (e.g., solder balls) without forming depressions in the tops of the terminals. To permit testing over a wide temperature range when thermal properties of the probe substrate differ from thermal properties of the package, the probe tips that are further from a central point may have a larger area than the probe tips that are nearer the central point.

Another embodiment of the invention is a testing process. The testing process generally includes connecting to test equipment a printed circuit board including a set of contact pads having a pattern that matches elevated terminals on a package containing a device. The process brings the package and the printed circuit board into contact so that the elevated terminals on the device make electrical connections with the contact pads on the printed circuit board. The test equipment can then test the device via the electrical connections of the printed circuit board to the package.

Yet another embodiment of the invention is a package testing system. The testing system includes: a contact structure having probe tips with flat contact surfaces; a tester electrically connected to the contact structure; and a mechanism for pressing together the flat contact surfaces and the terminals or BGA on the package. In some embodiments, the probe tips can be contact pads or bumps on a printed circuit board, and each contact surface has a width that is at least one half of the width of a corresponding one of the terminals.

BRIEF DESCRIPTION OF THE DRAWINGS

Use of the same reference symbols in different figures indicates similar or identical items.

DETAILED DESCRIPTION

In accordance with an aspect of the invention, a testing process improves the planarity of external terminals of a semiconductor device package having a BGA or similar external terminals. The testing process can employ a contact structure having probe tips that deform at least the package terminals having the highest elevation. As a result, overall variation in the elevation of the package terminals can be reduced.

Figure 2:
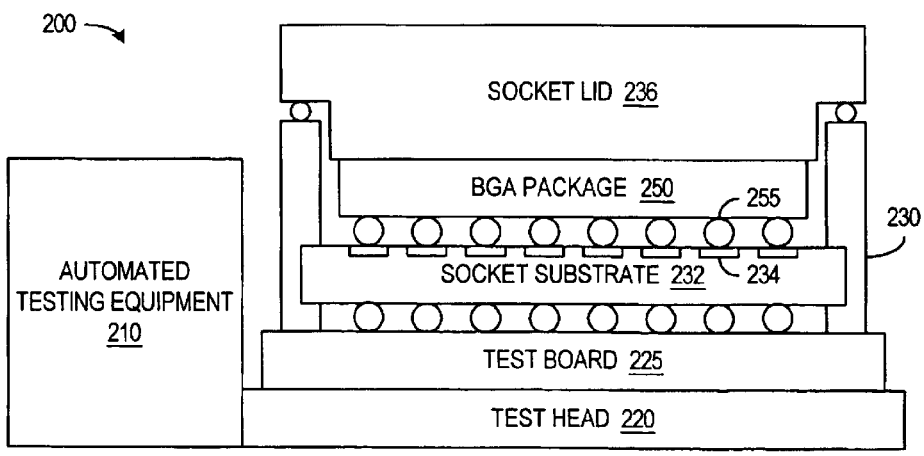
FIG. 2 is a block diagram of package testing equipment in accordance with an embodiment of the invention.

FIG. 2 is a block diagram of testing equipment 200 in accordance with an embodiment of the invention that improves the planarity of package terminals. Test equipment 200 includes automatic test equipment (ATE) 210, a test head 220 with a test board 225, a socket 230 including a socket substrate 232 and a socket lid 236. Test equipment 200 electrically tests a package 250 having external terminals 255.

Figure 1A:
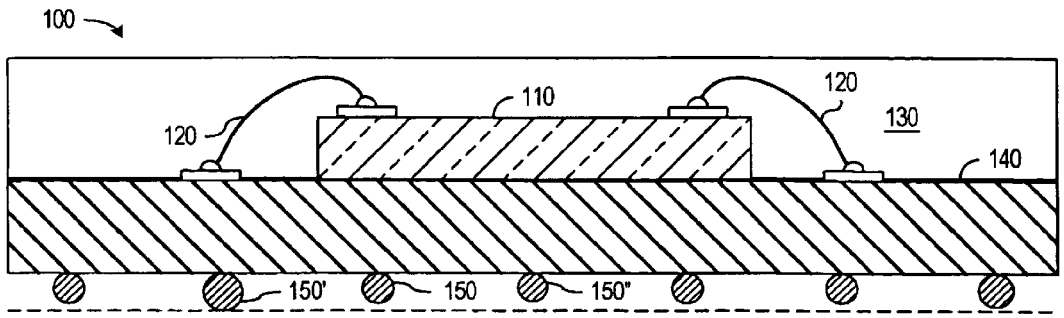
FIGS. 1A and 1B illustrate non-planar external terminals in conventional semiconductor device packages.
Figure 1B:
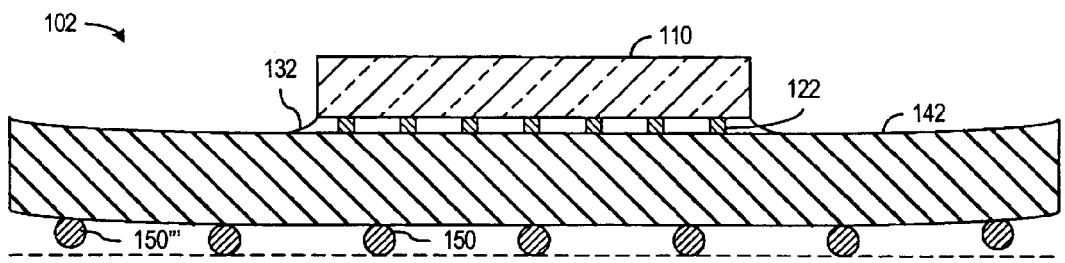

Package 250 can contain any type of device or devices including but not limited to memory chips, controllers, processors, application specific integrated circuits (ASICs), or any other type of integrated circuits or separate devices. The device can be connected to external terminals 255 by any desired technique including but not limited to wire bonding as illustrated in FIG. 1A or flip-chip packaging as illustrated in FIG. 1B. As external terminals 255, package 250 has metal bumps suitable for attachment to a printed circuit board or other electrical system, for example, by a solder reflow process. In an exemplary embodiment of the invention, external terminals 255 form a ball grid array (BGA). For current device packages, terminals 150 typically have an average height of between about 500 $\mu$m and about 1000 $\mu$m, depending on the pitch of the array. Terminals 150 may, for example, be solder balls or composite structures containing multiple metal layers such as stacked solder balls, or a pillar of copper or other metal that is capped with a solder layer, a solder ball, gold, or a gold stud.

For package testing, probe tips 234, which are part of socket substrate 232, are arranged in a pattern that matches the pattern of terminals 255 on a package 250. Probe tips 234 can be metal probes directly formed on socket substrate 232, but socket substrate 232 can further include one or more separate interconnect substrates or devices that provide electrical connections between probe tips 234 and test head 220.

For testing, package 250 is plugged into socket 230 were external terminals 255 contact probe tips 234. Socket lid 236 can then be clamped or otherwise operated to push package 250 toward probe tips 234 with sufficient force to inelastically deform terminals 255. ATE 210 then applies electrical input signals through test head 220 and probe tips 232 to terminals 255 and measures the resulting output signals to determine whether the device or devices in package 200 are functional and provide the required performance.

ATE 210, test head 220, and test board 225 can be standard test equipment that is available commercially from a variety of suppliers including Agilent Technologies, Inc., Teradyne, Inc., and LTX Corporation. ATE 210 generally performs the electrical testing of devices in package 250 in a conventional manner that depends on the type of device or devices in package 250.

In accordance with an aspect of the invention, probe tips 234 have a limited compliancy to facilitate deformation of terminals 255 during package testing. Socket substrate 232 can, for example, be a bumped or unbumped interconnect substrate or printed circuit board. Such interconnect substrates are typically made of an organic material such as polyamide or other insulating material and contain conductive traces that electrically connect bumps or contact pads on one side of the interconnect substrate to a contact pads and/or a BGA on an opposite side of the interconnect substrate. The bumps or pads on one side of the interconnect substrate form probe tips 234, which contact terminals 255 of package 250 for electrical testing and are able to apply sufficient pressure to cause deformation of terminals 255. The BGA or other terminals on the opposite side of the interconnect substrate provide electrical connections through test board 225 to test head 220 and ATE 210.

Socket 230 and socket substrate 232 including probe tips 234 could be one homogeneous/integrated structure or separable elements. In one embodiment, probe tips 234 are on a separate substrate attached as a removable part of socket 230. This permits use of socket 230 with different probe tips 234 for testing different packages. A socket 230 with replaceable probe tips 234 further has the advantage of permitting quick replacement of damaged probe tips so that downtime of ATE 210 is minimized.

Socket substrate 232 can be rigidly mounted or spring mounted in socket 230 to provide a limited compliancy to probe tips 240 as a whole. The amount of compliancy can range from 0 for a non-compliant or rigid mounting up to about 15 mils or more for a spring mounting. The desired deformation or planarization of terminals 255 during testing, as described further below, will generally control selection of a fixed or compliant mounting, the maximum travel distance of a compliant mounting, the number of springs or other compressible structures, and the spring constant or modulus of the compressible structures in a compliant mounting of socket substrate 232.

Probe tips 234, which can be created using printed circuit board technology, have the advantage of being easily configured to match a specific package. Another advantage of compact and non-compliant probe tips 234 is their durability when compared to needle, spring, or cantilever probes. Probe tips 234 can also have relatively large flat contact areas, as described further below. The flat contact areas, beside being less likely to be damaged during use and cleaning, do not have protrusions or sharp points that pick up and hold particles. As a result, probe tips 234 can continue to provide low contact resistance to the package under test even after prolonged use without cleaning.

In test equipment 200, a mechanical system such as a clamp on socket lid 236 creates the compression forces that provide good electrical connections and cause probe tips 232 to deform terminals 255 after package 250 is manually plugged into socket 230. Alternatively, a test handling system can include an automated mechanical arm or system that picks up package 250 and plugs package 250 into socket 230. At the same time, the automated system can apply pressure to package 250 to inelastically deform and improve the planarity of terminals 255. After the testing, the test handling system moves the good packages to shipping tray or shipping medium for subsequent transport.

Figure 3A:
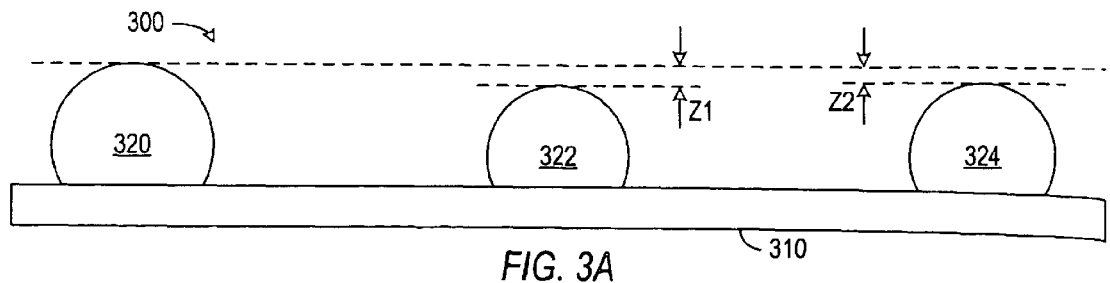
FIGS. 3A, 3B, 3C, and 3D illustrate a testing process in accordance with an embodiment of the invention that improves planarity of external terminal on a package.

FIGS. 3A to 3D illustrate a testing and planarizing process in accordance with an embodiment of the invention. FIG. 3A shows a portion of a package 300 before testing. Package 300 contains an interconnect substrate 310 on which a device or devices (not shown) are mounted. External terminals 320, 322, and 324 of the package 300 can be solder balls, metal pillar, or other conductive structures. Such terminals are generally arranged in a ball grid array (BGA). Ideally, all of external terminals 320, 322, and 324 rise to the same elevation relative to a reference plane. However, in the illustrated package 300, manufacturing variations have caused some terminals 322 to be shorter than the tallest terminals 320. Additionally, warping of interconnect substrate 310 also changes the relative elevation of terminals 320, 322, and 324. In the example of FIG. 3A, the tops of terminals 322 and 324 are respective offsets Z1 and Z2 away from a plane at the tops of the tallest terminals 320. If an offset Z1 or Z2 is too large, a weak or defective connection will result when attaching package 300 to a printed circuit board or other planar electrical system.

Figure 3B:
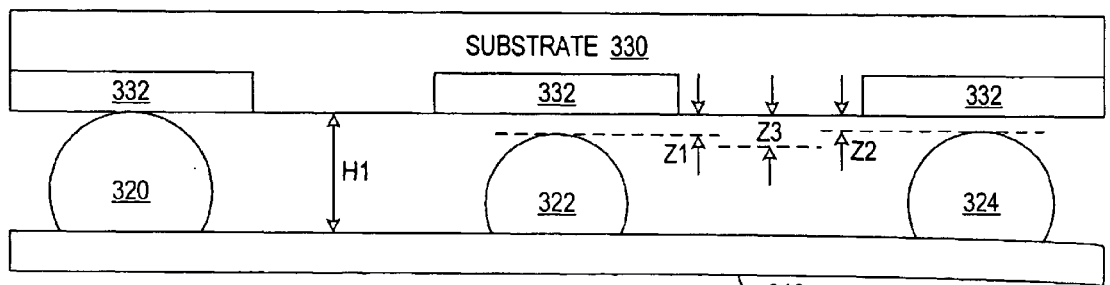

FIG. 3B illustrates a system including a test substrate 330 in accordance with an embodiment of the invention having flat probe tips 332. Flat probe tips 332 preferably have a width that is at least one half of the diameter of terminals 320, 322, and 324. In one embodiment of the invention, test substrate 330 is a printed circuit board and probe tips 332 are contact pads or metal traces on a surface of the printed circuit board. Probe tips 332 should be made of a metal capable of avoiding inelastic deformation while applying the forces required for inelastic deformation of terminals 320, 322, and 324. A material such as copper is suitable for probe tips 332 when the device terminals contain a malleable material such as a solder.

FIG. 3B shows probe tips 332 being level with the surface of substrate 330, but alternatively probe tips 332 may rise above the surface of test substrate 330 or even be recessed relative to the remainder of the surface of substrate 330. However, test substrate 330 should allow the bottoms of probe tips 332 to reach a desired separation from the surface of interconnect substrate 310 during testing or conditioning of package 300.

For testing, a test system drives package 300 and/or substrate 330 so that the bottoms of probe tips 332 contact at least some of the corresponding electrical terminals 320, 322, and 324, (e.g., until probe tips 332 reach the plane containing the tops of the tallest external terminals 320.) In FIG. 3B, substrate 330 is at a height H1 that corresponds to the plane containing the peaks of the terminals 320 having the greatest elevation, and some of probe tips 332 do not make good electrical contact with respective external terminals 322 and 324 of the package.

Figure 3C:
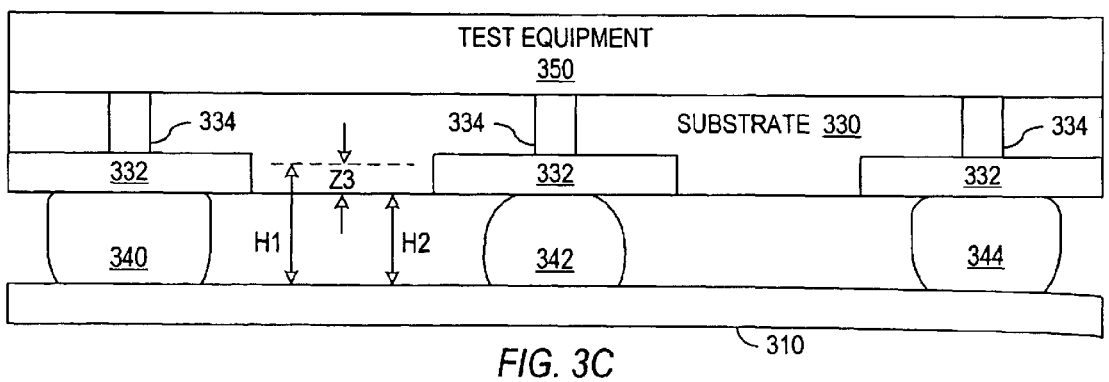

The test equipment then further drives substrates 310 and 330 closer by an overtravel distance Z3 to a separation H2 as shown in FIG. 3C. This process flattens the taller external terminals 320 and provides good electrical connections to the terminals 320, 322, and 324 of package 300. Standard testing equipment 350 can test package 300 using electrical signals transmitted through probe tips 332 and traces 334 in substrate 330.

Figure 3D:
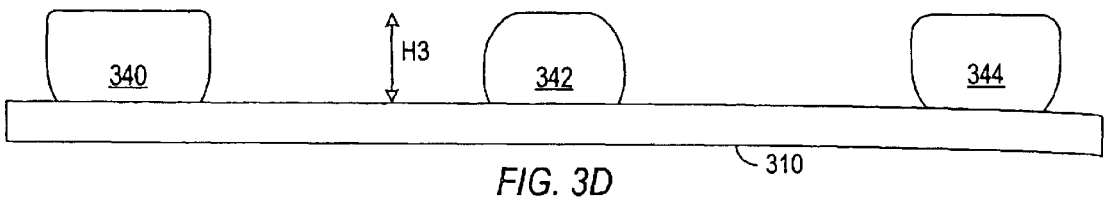

The testing process inelastically deforms the terminals 320, 322, and 324. Accordingly, when test substrate 330 is withdrawn from contact with package 300 as shown in FIG. 3D, flattened terminals 340, 342, are 344 are more uniformly of the same height H3. The tops of terminals 340, 342, 344 thus have better planarity than do terminals 320, 322, and 324, and the improved planarity can enhance the joint integrity when attaching the probed package to a printed circuit board.

Overtravel distance Z3 generally must at least be sufficient to provide a low contact resistance at each terminal 320, 322, and 324 to permit electrical testing of the package. Even a small overtravel distance Z3 (e.g., the minimum overtravel required for electrical testing) generally results in a flattening of the largest of the terminals, improving the overall planarity of the terminals and therefore improving the integrity of interconnection joints in a system subsequently assembled using package 300. Larger amounts of overtravel may provide further improvements in planarity until the overtravel distance Z3 provides some inelastic flattening of all terminals 320, 322, and 324. After the point where each terminal is at least partially flattened, the variations in the planarity of terminals 340, 342, and 344 depends on the variations in the planarity and the compliancy of probe tips 332. Probe tips 332 can be planarized during manufacture using a precision process such as chemical mechanical polishing (CMP), so that the variations in the planarity of terminals is small after testing.

Figure 4:
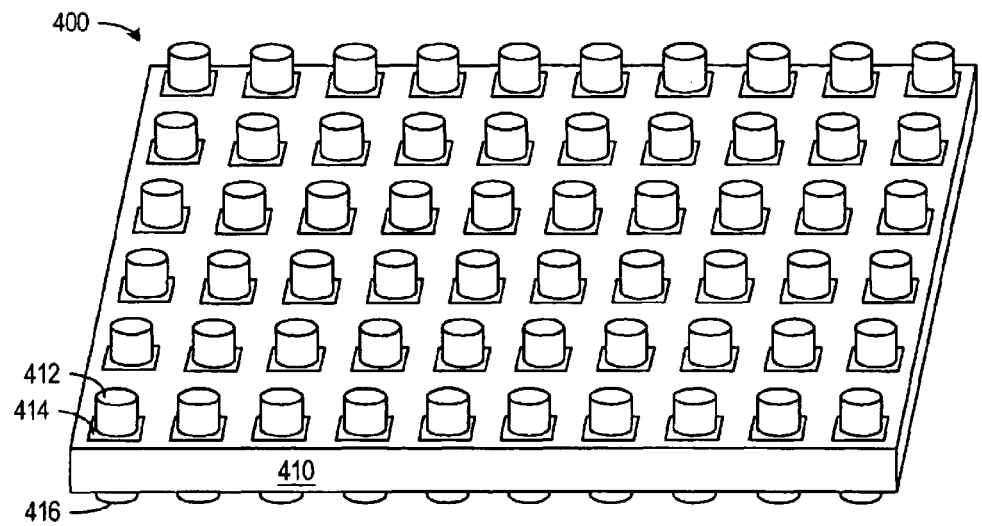
FIG. 4 is a perspective view of a probe in accordance with an embodiment of the invention for testing and planarizing of external terminals of a package being tested.

FIG. 4 shows a perspective view of a socket substrate 400 in accordance with an embodiment of the invention having probe tips 412 formed on contact pads 414 or traces of a printed circuit board 410. Traces or vias (not shown) connect contact pads 414 to respective terminals 416 on an opposite side of printed circuit board 410. Terminals 416 are for connection to test equipment, e.g., to a standard test board or a standard test head.

In an exemplary embodiment of the invention, printed circuit board 410 is made of an insulating material such as polyimide containing conductive traces made of a metal such as copper or aluminum. Board 410 can be sized to fit into a receptacle in the test equipment but has contact pads 414 in a pattern that matches the terminals (e.g., the BGA) on the packages to be tested. Such BGA currently have a common grid spacing of on the 1 or 2 mm (e.g., 1.7 mm). Probe tips 412 can be formed as pillars of a metal such as aluminum, copper, platinum, rhodium, or tin-lead or conductive epoxy or organic material having a height between 0 and about 250 $\mu$m. As mentioned above, a process such as CMP can planarize the tops of probe tips 412. The area or diameter of each probe tip 412 generally depends on the size of the external terminals of the package being tested. For a BGA containing solder balls of a diameter of about 800 $\mu$m, a diameter about 400 $\mu$m or larger is desirable for probe tips 412.

In accordance with an aspect of the invention, the material of board 410 can be selected to match the thermal properties of the interconnect substrate in the packages to be tested. Accordingly, the pattern of probe tips 412 on substrate 400 that matches the pattern of the external terminals on the packages being tested at one temperature will also match the pattern of the external terminals at an elevated temperature. Alternatively, if the materials of board 410 and the interconnect substrate differ, the pattern of probe tips 412 (and pads 414) can be designed to match the pattern of the package terminals at any desired test temperature.

Figure 5A:
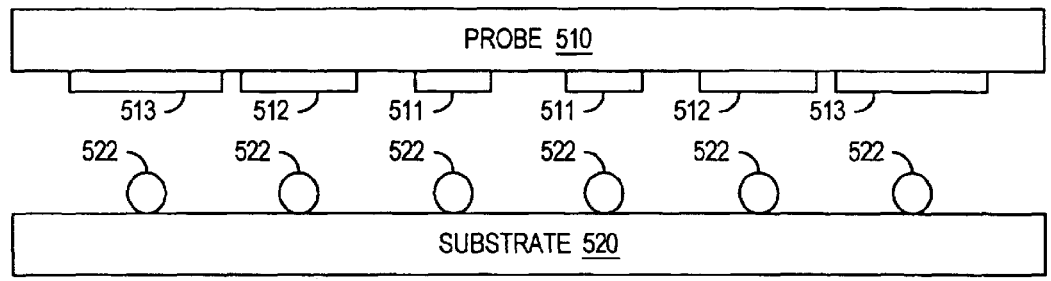
FIGS. 5A and 5B illustrate a probe in accordance with an embodiment of the invention that maintains alignment with a package under test over a range of temperatures.
Figure 5B:
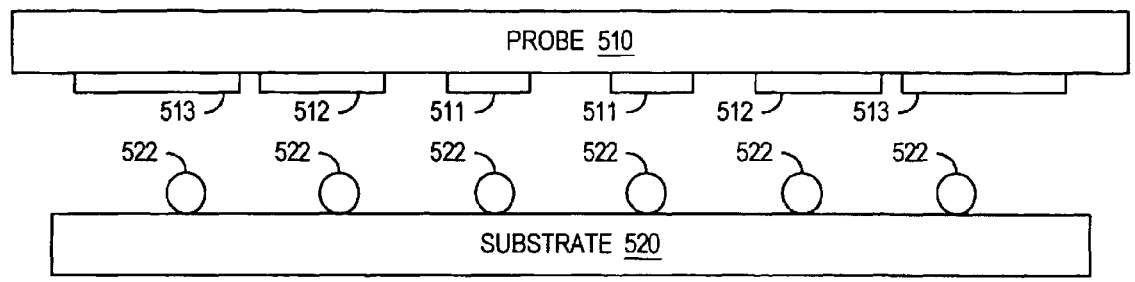

In accordance with a further aspect of the invention, the pattern or size of probe tips on one probe card make proper contact with the terminals of a package over a wide range of temperatures even if the package and the probe have different thermal properties. FIGS. 5A and 5B show a probe 510 having probe tips 511, 512, and 513 that increase in size with distance from the center of probe 510. For probing, the center of probe 510 is aligned with the center of a package 520. FIG. 5A illustrates how external terminals 522 of package 520 align with probe tips 511, 512, and 513 at a first temperature (e.g., room temperature.) An "at-temperature"

test can be performed at an elevated temperature (e.g., at 120° C.). As a result, thermal expansion of package 520 may differ from expansion of probe 510 because of a difference in their respective coefficients of thermal expansion. Normally, a differential expansion of package 520 would move each terminal 522 relative to the corresponding probe tip 511, 512, or 513, with the amount of movement being proportional to the distance between the terminal 522 and the center of package 520. To compensate for the differential expansion, pads 511, 512, and 513 extend over the range of positions of the corresponding terminals 522 so that portions of probe tips 511, 512, and 513 remain aligned with respective terminals 522 even at the elevated temperature illustrated in FIG. 5B.

FIGS. 5A and 5B show an embodiment where the area of the pads increases with distance from the center of probe 510. Alternatively, pads 511, 512, and 513 can all be made the same size as the largest pads 513.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A process for testing a package containing a device, comprising:

bringing probe tips into contact with external terminals on the package;

using the probe tips to inelastically deform the external terminals to improve planarity of the external terminals; and electrically testing the device through electrical connections of the probe tips to the external terminals.

2. The process of claim 1, wherein bringing the probe tips into contact with the external terminals comprises plugging the package into a socket.

3. The process of claim 2, wherein using the probe tips comprises applying pressure to the package while in the socket so that the probe tips deform the external terminals.

4. The process of claim 1, wherein each probe tip has a flat contact area and flattens a corresponding one of the external terminals, while simultaneously providing an electrical connection to the external terminals.

5. The process of claim 4, wherein the flat contact area has a width that is at least one half of a width of one of the terminals.

6. The process of claim 1, wherein the probe tips are affixed to a substrate.

7. The process of claim 6, wherein the substrate is a printed circuit board.

8. The process of claim 7, wherein the probe tips comprise bonding pads disposed on a surface of the printed circuit board.

9. The process of claim 7, wherein the probe tips comprise bumps disposed on a surface of the printed circuit board.

10. The process of claim 1, wherein the probe tips are sized to accommodate relative thermal expansion of a pattern of the external terminals.

11. The process of claim 1, wherein the external terminals form a ball grid array.

12. The process of claim 1, wherein the package comprises a substrate having a first side on which the device is mounted and a second side on which the external terminals reside.

13. The process of claim 12, wherein the package is a flip-chip package.

14. A package testing system comprising:

a substrate;

probe tips that are on the substrate and have flat contact surfaces;

a tester electrically connected to the probe tips; and a mechanism capable of pressing external terminals of a package against the probe tips with sufficient force to inelastically deform the external terminals.

15. The system of claim 14, wherein each contact surface has a width that is at least one half of a width of a corresponding one of the external terminals.

16. The system of claim 14, wherein the substrate comprises a printed circuit board having contact pads in a pattern that matches a pattern of the external terminals of the package.

17. The system of claim 16, wherein the probe tips comprise the contact pads of a printed circuit board.

18. The system of claim 16, wherein the probe tips comprise bumps on the printed circuit board.

19. The system of claim 14, wherein the probe tips have sizes that accommodate relative thermal expansion of a pattern of the external terminals.

20. The system of claim 14, wherein the mechanism is sized to accommodate a flip-chip package comprising a semiconductor device mounted on one side of a substrate, and the probe tips contact the external terminals that are on an opposite side of the substrate.

21. The system of claim 14, wherein the flat contact surfaces of the probe tips are in a plane such that inelastic deformation caused by the mechanism pressing on the external terminals improves planarity of the external terminals.

* * * * *